United States Patent [19]

Quan et al.

[11] Patent Number: 4,794,217
[45] Date of Patent: Dec. 27, 1988

[54] INDUCTION SYSTEM FOR RAPID HEAT TREATMENT OF SEMICONDUCTOR WAFERS

[75] Inventors: Pei Xin Quan; Dong Yan Hou; Bi-Xian Chen; Teng Ge Ma; Hui Wang Lin; Zhi Jian Li, all of Beijing, China

[73] Assignee: Qing Hua University, China

[21] Appl. No.: 38,516

[22] Filed: Apr. 15, 1987

Related U.S. Application Data

[63] Continuation-in-part of Ser. No. 815,867, Jan. 3, 1986, abandoned.

[30] Foreign Application Priority Data

Apr. 1, 1985 [CN] China ................................. 85100131
Mar. 5, 1987 [CN] China ................................. 87202679

[51] Int. Cl.4 .................................................... H05B 6/10
[52] U.S. Cl. ................................ 437/247; 219/10.491; 219/10.67; 219/342; 219/10.41
[58] Field of Search ....................... 219/10.49 R, 10.67, 219/10.47, 10.43, 10.41, 10.491, 339, 342, 347, 357; 148/1.5, 181; 118/725, 728–732, 500, 50.1, 620; 29/582

[56] References Cited

U.S. PATENT DOCUMENTS

| | | | |
|---|---|---|---|
| 3,521,018 | 7/1970 | Boerger et al. | 219/10.49 R |
| 3,892,940 | 7/1975 | Bloem et al. | 219/10.67 X |
| 4,149,905 | 4/1979 | Levinstein et al. | 148/1.5 |
| 4,263,087 | 4/1981 | Tanabe et al. | 219/10.49 R X |
| 4,286,867 | 8/1981 | Hill et al. | 219/10.49 R |
| 4,449,037 | 5/1984 | Shibamata et al. | 219/10.49 R |
| 4,522,149 | 6/1985 | Garbis et al. | 219/10.67 X |
| 4,567,645 | 2/1986 | Cavanagh et al. | 148/1.5 X |
| 4,579,080 | 4/1986 | Martin et al. | 219/10.67 X |

OTHER PUBLICATIONS

"Rapid Wafer Heating: Status 1983", Peter S. Burggraff, *Semiconductor International*, Dec., 1983, pp. 69–74.
"Rapid Isothermal Annealing of Ion Implantation Damage Using a Thermal Radiation Source", by Fulks, Russo, Handley and Kamins, Appl. Phys. Lett. 39(8).
"IA-200", Varian Associates, Inc.
"Nova ROA-400 Rapid Optical Annealer", Eaton Corporation, Beverly, Mass.
"Automatic Rapid Annealing System", by AET, Division Micro-Electronique.
"Transient Annealing of High-Dose As+-Implanted Silicon with Infrared Irradiation", by Dong Yan Hou, Pei Xin Qian, Zhi Jian Li, *Chinese Journal of Semiconductors*, vol. 4, No. 6, Nov. 1983.
"Full Ion Implanted MOS Technology Using Infra Transient Annealing", by Dong Yan Hou, Teng Ge Ma, Bi-Xian Chen and Pei Xing Qian, *Chinese Journal of Semiconductors*, vol. 6, No. 5, Sep. 1985.

*Primary Examiner*—Philip H. Leung
*Attorney, Agent, or Firm*—Majestic, Gallagher, Parsons & Siebert

[57] ABSTRACT

A semiconductor wafer is transported by a mechanical system into or out of a quartz housing filled with a protection gas. The wafer is placed between and spaced apart from two graphite plates. A RF induction coil surrounding the quartz housing is used to heat the graphite plates. Radiation from the heated graphite plates heats the wafer from room temperature to an elevated desired temperature. During the time period when a wafer absorbs radiation primarily through electron-to-electron transition, heat convection and conduction by the protection gas conveys heat from the graphite plates to the wafer to accelerate the heating of the wafer and reduces temperature nonuniformity of the wafer. A reflector means in the form of a second smaller housing is placed inside the larger quartz housing; the second housing formed by the reflector means encloses the two graphite plates and the wafer except for an opening for delivering and withdrawing the wafer and for a hole in upper part of the housing for determining temperature of the water. The reflector means reflects radiation back towards the graphite to improve heating efficiency. The second housing formed by the reflector plate confines the heating of the protection gas to the portion inside the second housing, thereby improving the efficiency of the gas in transporting heat by convection and conduction. In such manner heating of the wafer to a given temperature is accelerated and the uniformity of wafer temperature during the heating is improved.

12 Claims, 5 Drawing Sheets

INDUCTION SYSTEM FOR RAPID HEAT TREATMENT OF SEMICONDUCTOR WAFERS

CROSS REFERENCE TO RELATED APPLICATION

This application is a continuation-in-part of U.S. application entitled "System For Heat Treatment Of Semiconductors", Ser. No. 815,867, filed Jan. 3, 1986 by the applicants of the present application, now abandoned.

BACKGROUND OF THE INVENTION

This invention relates in general to systems for annealing ion implantation damage and to activate ion-implanted dopants in semiconductor wafers, and in particular to a system for rapid isothermal annealing of the ion implantation damage and for activating dopants.

Since the early 1960's ion implantation has been adopted as a doping method for semiconductor wafers. To remove the damage induced by ion implantation and to activate the dopants electrically, diffusion furnaces have been used conventionally to anneal the wafers. In order to achieve uniform results, it is necessary for the conditions in the furnace to reach thermal equilibrium. For this reason, diffusion furnace annealing methods have innately long time constants. Thus, the heating time of semiconductor wafers in the diffusion furnace annealing methods cannot be less than 10 minutes; in general the annealing time in such methods is longer than 30 minutes. See, for example, "Rapid Wafer Heating: Status 1983" by Peter S. Burggraaf, *Semiconductor International*, December 1983, pp. 69–74 at p. 71, and *Principle And Technology of Ion Implantation*, Institute of Low Energy Nuclear Physics, Beijing Normal University, Beijing Press, Beijing, 1982.

Because of the lengthy annealing time required at high temperatures in diffusion furnace annealing, the dopants implanted become extensively redistributed. Thus, the PN junction depth in semiconductors processed conventionally is typically larger than 0.4 microns and the activation may be low for high-dose implanted dopants. With the development of very large scale integrated circuits (VLSI), it is frequently required to reduce the depth of a PN junction to as little as 0.2 microns or less and to greatly reduce the sheet resistance of the doped area. Conventional diffusion furnace annealing is therefore not suitable for VLSI manufacturing. It is therefore desirable to provide an alternative heating system which anneals the wafer faster than conventional diffusion furnace annealing methods and which achieves very high efficiency of activation, especially for high-dose implanted dopants.

For the reasons discussed above, different annealing methods have been developed since 1975 as alternatives to the conventional diffusion furnace system. Pulsed or scanning lasers and electron beams have been proposed for rapidly heating the wafer in order to accurately control dopant redistribution. While these systems may be useful for research and special applications, these systems may be too expensive or too complicated for industrial use.

Varian Associates, Inc. designed a vacuum transient annealing system, Varian model IA-200, as illustrated in FIG. 1. As shown in FIG. 1 a semiconductor wafer 2 is placed between tantalum reflectors 1 and 5. A resistance heated graphite element 4 is used as the radiant power source for heating the wafer. A multilayer tantalum shutter 3 is placed between the wafer and the heater to control the time for heating the wafer. Reflectors 1 and 5 improve heat efficiency by reflecting the radiation from the graphite element otherwise lost towards the wafer. The annealing system is placed in a metal container.

While the Varian system does activate more dopants in the annealing process in comparison to conventional furnaces, apparently it still cannot completely activate high-dose implanted dopants. For example, the activation is about 85% of $6 \times 10^{15}/cm^2$ $A_s^+$ implanted silicon (*Applied Physics Leters*, 39, 604, 1981). Furthermore, in the Varian system, the metal container containing the components 1–5 is evacuated so that the annealing process is performed in vacuum. Thus, the wafer is heated by radiation only. Generally, it takes ten seconds for a wafer to be heated from room temperature to 1000° C. While the Varian system heats the wafer at a rate much faster than that of conventional methods, it may be desirable to provide heating systems which can heat at a still faster rate for many VLSI applications to further reduce dopant redistribution. In addition, since surface thermal degradation easily occurs in vacuum, it appears that the Varian system cannot be used to anneal compound semiconductors.

Aside from the Varian system, three other commercial systems are available today from AG associate, Veeco/Kokusai and Eaton. These three systems use different configurations of high intensity lamps as energy sources. The Varian system and the three high intensity lamp systems are discussed by Burggraaf in the article referenced above. Thus, the rapid isothermal annealing methods have all used a form of radiation heat transfer instead of heat conduction or convection for rapidly heating the wafer.

Since the amount of dopant redistribution is strongly related to the annealing time, it is desirable to improve the efficiency of radiation heat transfer. As discussed in the Burggraaf article referenced above, wafer temperature uniformity and reduction of metal ion contamination are two of the most important requirements for designing rapid wafer heating systems.

The rapid isothermal annealing methods proposed by Varian and three other companies have achieved annealing times on the order of 10 seconds compared to 30 minutes for diffusion furnace annealing methods. In such rapid isothermal annealing methods, dopants redistribution can be accurately controlled. In addition, rapid isothermal annealing methods provide processing advantages over diffusion furnace annealing. Rapid isothermal annealing permits serial single wafer processing which has better repeatability and control characteristics than conventional diffusion furnace methods. Individual wafers are also easier to handle than batches. All these features are very important for VLSI processing. The serial individual processing permitted by rapid isothermal annealing methods lends itself to automation and blends easily with other cassette-to-cassette production equipment now available for wafer fabrication. Vendors have also suggested that rapid isothermal annealing methods use only 10% of the power required for diffusion furnaces and therefore lightens the load on the air-conditioning system in a processing area. Since wafers are processed in batches in diffusion furnaces, furnace annealing requires large clean rooms. In contrast, rapid isothermal annealing requires much less clean room area and less space.

While rapid isothermal annealing appears to give much improved results compared to conventional furnace annealing and appears poised to replace the latter as the annealing method of choice, the presently available systems are not entirely satisfactory. Thus, even though the Varian system can be used to heat a wafer from room temperature to 1000 degrees C. in about 10 seconds, some dopant redistribution will still occur so that it is desirable to reduce the annealing time further. Furthermore, in order to achieve uniform temperature throughout the surfaces of the wafer, the radiation field from a lamp or graphite element must be very uniform. This may be difficult to achieve. In addition, the conventional epitaxial system is also unsuitable for rapid isothermal annealing. In epitaxial system, the semiconductor wafers are placed directly on the graphite plate, which is heated by RF power and the wafers are heated through heat conduction. In this way the wafers and the graphite plate are heated and cooled simultaneously. Therefore the process cannot be quick enough for rapid thermal treatment. It is therefore desirable to provide new improved rapid heat treatment systems for annealing semiconductors in which such difficulties are alleviated.

SUMMARY OF THE INVENTION

When a semiconductor wafer is annealed, the wafer is heated from room temperature to about 1000 degrees centigrade. When the wafer at room temperature is first heated by a black body radiator such as a graphite heater element, the wafer absorbs heat mainly by optical intrinsic absorption, that is, band-to-band electron transition. Initially, a small amount of energy is also absorbed by the available free-carrier, ionized-dopant states. As the wafer is heated to above 300 degrees Centigrade, additional free carriers are generated. The heat absorption then accelerates, with the free carriers becoming the main source of absorption. In the initial stage of heating much of the radiation from the graphite heater simply passes through the wafer without being absorbed. Thus, during a significant portion of the heating time in the Varian system described above, the wafer is a poor absorber of radiation from the graphite heater.

This invention is based on the observation that the 10 second heating time can be further shortened if a gas is used to convey heat between the graphite heater and the wafer to accelerate the absorption of heat by the wafer during the initial stage of heating when the wafer absorbs radiation mainly through band-to-band electron transition. Instead of heating the wafer solely through radiation as in the existing rapid isothermal heating systems, applicants proposed the heating of the wafer through radiation assisted by heat convection and conduction through the use of a gas medium between the wafer and the graphite heater. The gas medium conveys heat from the graphite heater to the wafer through heat convection and conduction and shortens the time required to heat the wafer from room temperature to about 1000 degrees centigrade from 10 seconds to about 3 seconds.

Thus, according to one aspect of the invention, the apparatus for a rapid heat treatment of semiconductor wafers comprises a housing and means inside a housing for holding a semiconductor wafer in which ions have been implanted. The apparatus further comprises a graphite heater in said housing spaced apart from the wafer for rapidly heating the wafer by radiation and means inside the housing for holding the heater. The apparatus comprises a gas medium in the housing for accelerating wafer absorption of heat originating from the graphite heater during a time period when radiation is absorbed by the wafer primarily through band-to-band electron transition. The gas medium also improves wafer temperature uniformity when it is heated. The apparatus further comprises means for rapidly delivering the holding means and the wafer to a location which is inside the housing and spaced apart from the heater so that the wafer is heated by heat from the heater and for rapidly withdrawing the wafer after heating. The wafer holding means, the heater holding means, the housing and the portion of the delivering and withdrawing means inside the housing during the heating process are made of quartz to reduce metal ion contamination.

Thus, according to the aspect of the invention above, heating time in a rapid isothermal heating system is reduced by employing a gas medium; the gas medium also has the effect of improving wafer temperature uniformity when it is heated. The housing, and the means for holding the wafer and the heater and the portions of the delivering and the withdrawing means inside the housing during the heating process are made of quartz. Thus, no metal is used in the vicinity of the wafer so that metal ion contamination is reduced.

Another aspect of the invention is directed towards an apparatus for rapid heat treatment of semiconductor wafers which comprises a first housing for holding a semiconductor wafer in which ions have been implanted and a graphite heater in the housing spaced apart from the wafer for rapidly heating the wafer by radiation. The apparatus comprises reflector means in the first housing for reflecting radiation from the graphite heater towards the graphite, said reflector means defining a second housing which encloses both the graphite heater and the wafer, said second housing defining an opening. The apparatus comprises means for rapidly delivering the wafer through the opening to a location inside the second housing and spaced apart from the heater so that the wafer is heated by radiation from the heater and for rapidly withdrawing the wafer through the opening after heating. The apparatus includes a gas in the first and second housings for accelerating, by means of heat convection and heat conduction, absorption of heat originating from the graphite heater by the wafer during a time period when the wafer absorbs radiation from the heater incident thereon primarily through band-to-band electron transition, and for improving the uniformity of wafer temperature when it is heated. Hence the heat convection and conduction functions are performed substantially only by the portion of the gas inside the second housing, thereby increasing the efficiency of the gas in accelerating the absorption of heat by the wafer. The second housing also substantially prevents the portion of the gas outside the second housing from contacting the wafer and heater, thereby reducing heat loss and temperature nonuniformity of the wafer caused by such contact.

DETAILED DESCRIPTION OF THE INVENTION

Figure 1:
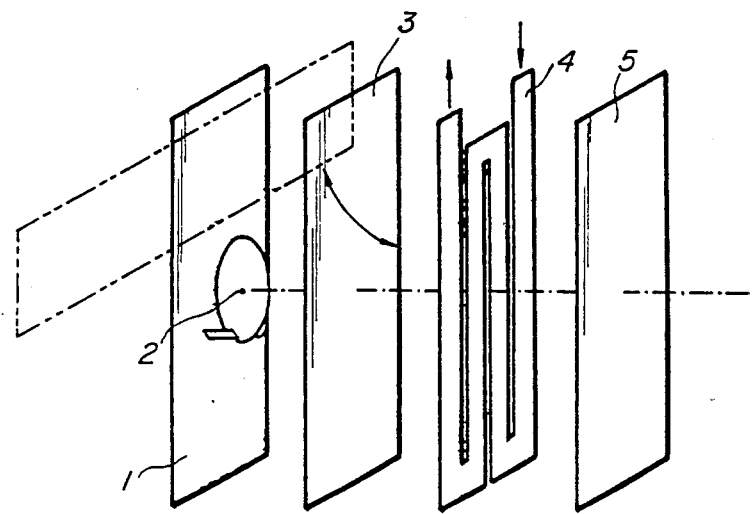
FIG. 1 is an illustration of model IA-200 by Varian Associates, Inc. for annealing semiconductors to illustrate one prior art system.
Figure 2:
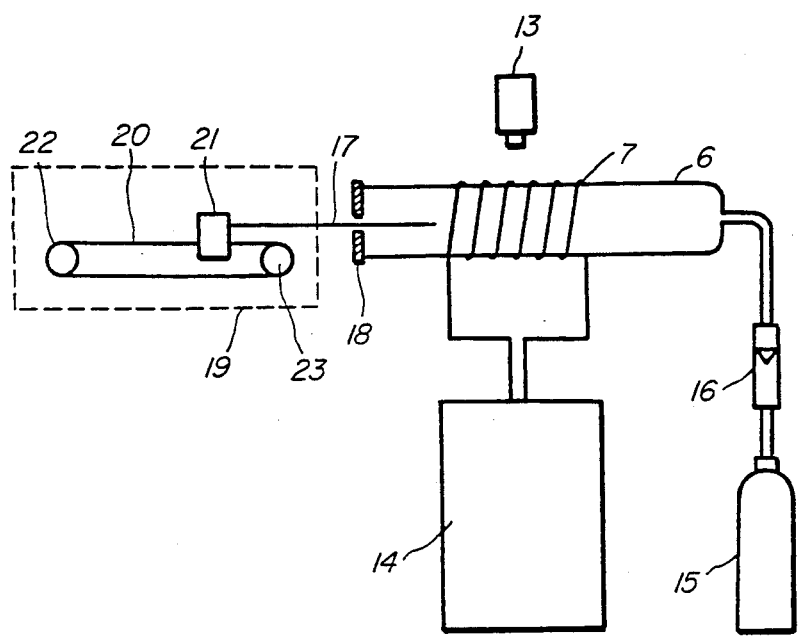
FIG. 2 is a schematic view of an annealing system illustrating this invention.

FIG. 2 is a schematic view of a system for heat treatment of semiconductors to illustrate the invention. As shown in FIG. 2 a semiconductor wafer is placed on a quartz wafer holder 11 (not shown in FIG. 2). The quartz rod 17 is mounted onto a fixed stand 21. The fixed stand is attached to a loop of thin steel wire 20 which rides on a master wheel 22 and a slave wheel 23. By rotating master wheel 22, the fixed stand 21 is transported away from or towards a rectangular quartz housing 6. Consequently, wafer holder 11, quartz rod 17 and the semiconductor wafer placed on the wafer holder 11 are also caused to move relative to housing 6. The quartz rod 17, wire 20, stand 21 and wheels 22 and 23 form a mechanical delivering and control system 19 for moving the semiconductor wafer relative to the quartz housing 6.

The furnace portion of the heat treatment system will now be described. A radio frequency (RF) induction coil 7 is wound around housing 6. A radio frequency power source 14 supplies power to coil 7. In one embodiment that has been found to be satisfactory, source 14 supplies 15 kw to coil 7. Coil 7 and source 14 form a RF induction furnace. The temperature of the wafer may be measured by means of a pyrometer 13 which can measure directly the temperature of the wafer without the need of connecting the pyrometer to the wafer by electrical wires. The quartz housing 6 is filled with a gas such as substantially pure nitrogen or a mixture of substantially pure nitrogen and hydrogen from a gas container 15 controlled by a valve 16.

Figure 3:
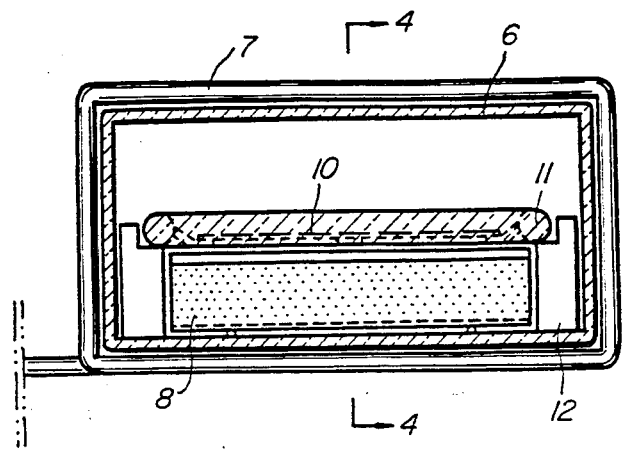
FIG. 3 is a schematic diagram of a portion of the annealing system of FIG. 2 illustrating an embodiment of the invention.
Figure 4:
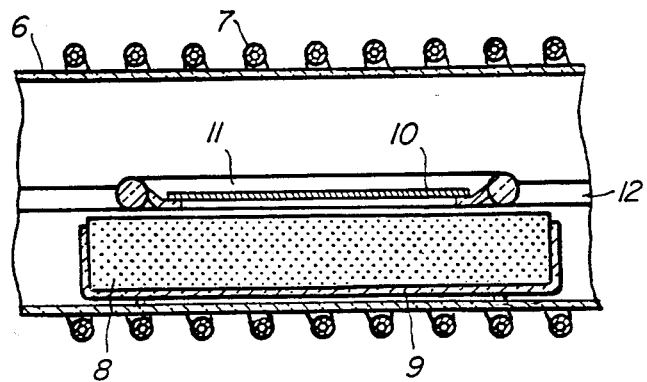
FIG. 4 is a cross-sectional view of a portion of the annealing system of FIG. 3 taken along the line 4—4 in FIG. 3.

FIG. 3 is a cross-sectional view of the quartz housing 6 of FIG. 2. FIG. 4 is a cross-sectional view of the quartz housing 6 taken along line 4—4 in FIG. 3. As shown in FIG. 3 housing 6 is surrounded by coil 7. Inside housing 6 is a quartz track support structure 12 for supporting a quartz wafer holder 11; the track is such that the holder may be smoothly slided into and out of housing 6. A semiconductor wafer 10 is then placed on the holder 11. The holder 11 is connected to quartz rod 17 of FIG. 2 for moving the holder relative to housing 6. Quartz track 12 is such that it supports holder 11 so that holder 11 sits slightly above a graphite plate 8. The graphite plate is in turn supported by a quartz stand 9 in housing 6. When power at radio frequency is supplied to coil 7, it causes the graphite plate to heat up. The graphite plate, when it is at high temperature, emits infrared radiation towards wafer 10 for heating the wafer. Coil 7 is made of an annealed copper tube through which a cooling fluid may flow.

The protection gas, such as nitrogen or a mixture of nitrogen and hydrogen, serves as a heat convection and conducting means for conveying heat from the graphite plate 8 to wafer 10, particularly during the initial stage of heating when the efficiency of the wafer in absorbing infrared radiation from the graphite plate is still low. During the initial stage, the wafer absorbs radiation incident thereon primarily through electron-to-electron transition, since there are relatively few free carriers. It is during this stage that heat convection and conduction by the gas medium significantly accelerates the the rise in temperature of the wafer so that enough carriers are generated to become the main source of heat absorption. For this reason, it takes only about 3 seconds for heating a wafer from room temperature to 1000 degrees Centigrade. This is in contrast to about 10 seconds required for the Varian model IA-200 to heat a wafer to about the same temperature. Of course, the gas medium assists in the conveying of heat from the graphite heater to the wafer even after the free carriers in the wafer become the main source of absorption. The protection gas also improves wafer temperature uniformity. The effect of the protection gas is such that, after annealing, no slipping and little or no warping of wafers is observed.

The mechanical delivering and control system is capable of controlling the heating time of the wafer to within 0.1 second. The construction of the heat treatment system is simple and highly efficient. For example, during one test, 60 wafers are annealed per hour. The activation efficiency is found to be high and dopant redistribution small. For example for $10^{16}/cm^2$ $A_s^+$ implanted silicon, after annealing the electrical activation of dopants is close to 100% and the redistribution is about 0.1 microns. The quartz housing can be washed easily. Since little or no metal is used the contamination of the wafer by metal ions is greatly reduced. The process is well compatible with conventional MOS technology and 1 micron channel MOSFET with satisfactory electrical characteristics has been made. This invention can be applied to annealing of compound semiconductors, such as GaAs. Stand 9, holder 11 and track 12 are all made of quartz so that there is no metal inside the quartz housing 6; this reduces contamination by metal ions.

The annealing process is as follows. Quartz housing 6 is filled with a protection gas supplied by gas bottle 15 through a valve 16. The graphite plate is then heated by supplying current to coil 7. The area of the surface of the graphite plate facing the wafer is a little bigger than that of the semiconductor wafer so that the radiation supplied by the graphite covers all of the wafer. The pyrometer is placed above the quartz housing for detecting temperature of the graphite through an opening between different turns of the induction coil. Using rod 17, wafer 10 and holder 11 are pushed along track 12 until it is on top of the already heated graphite. The wafer is not in contact with the graphite. At this time the pyrometer measures the temperature of the wafer. The time the wafer is heated by the graphite is controlled by the mechanical delivering and control system 19. After annealing, the wafer holder 11 and wafer 10 are withdrawn rapidly by the mechanical system 19.

Besides annealing of ion-implanted semiconductors, this invention can be applied to recrystallize polysilicon on insulators (SOI). By changing the shape of graphite heater, the melting zone of a strip shape can be obtained. After the melting zone is formed, the wafer stand will be withdrawn slowly from the graphite heating section (0.1 cm/second). The recrystallization will be completed at the same time. This invention has other applications:

(1) PSG reflow. In fact, this step is completed during the same time required for the wafer to be annealed.

(2) forming silicides.

(3) making ohmic contacts of shallow PN junctions.

Figure 5:
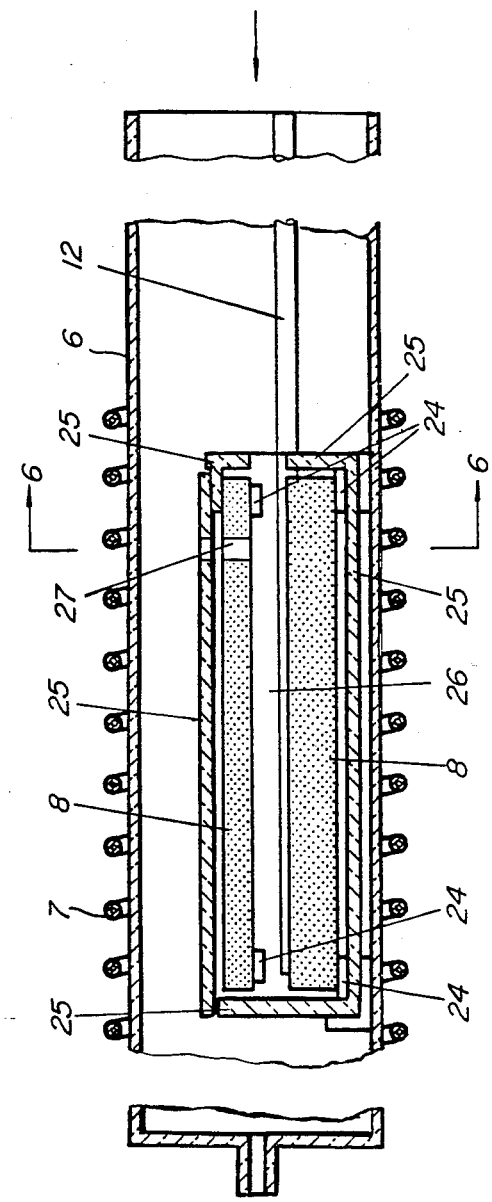
FIG. 5 is a schematic diagram of a portion of the annealing system of FIG. 2 illustrating the preferred embodiment of the invention.
Figure 6:
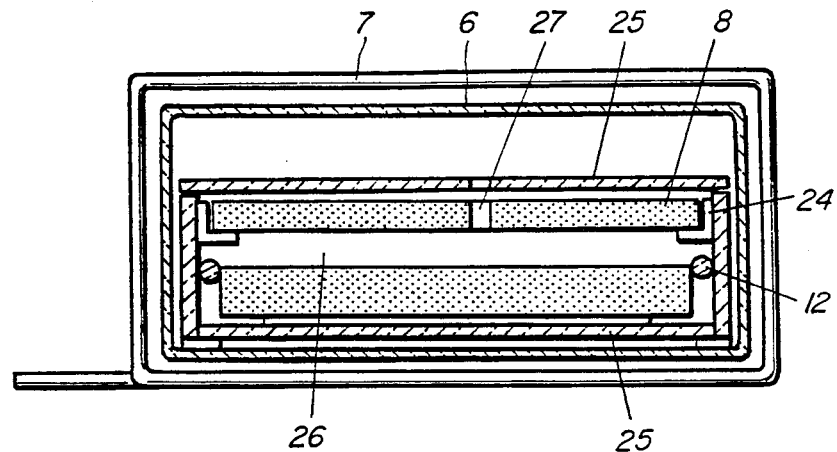
FIG. 6 is a cross-sectional view of a portion of the annealing system of FIG. 5 taken along the line 6—6 in FIG. 5.
Figure 7:
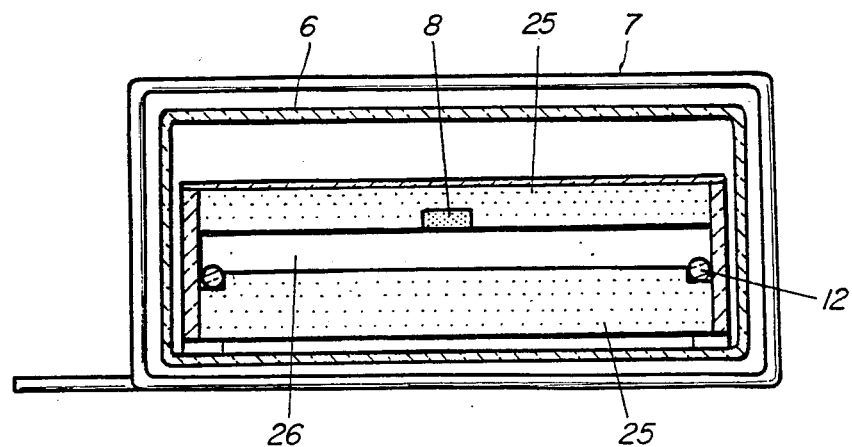
FIG. 7 is a view of a portion of the annealing system of FIG. 5 as viewed along the direction K in FIG. 5.

The above-described rapid isothermal heating system in reference to FIGS. 2-4 can be further improved as in the preferred embodiment illustrated by FIGS. 5-7. FIG. 5 is a schematic diagram of a portion of the annealing system of FIG. 2 illustrating the preferred embodiment of the invention. FIG. 6 is a cross-sectional view of a portion of the annealing system of FIG. 5 taken along the line 6-6 in FIG. 5. FIG. 7 is a view of a portion of the annealing system of FIG. 5 as viewed along the direction K in FIG. 5.

In the preferred embodiment, the heating time of a wafer from room temperature to 1000 degrees centigrade is reduced to below 2 seconds by improving the heating efficiency of the wafer. Identical parts in the preferred embodiment of FIGS. 5-7 and the embodiment of FIGS. 2-4 identified by the same numerals. To simplify the figures, the wafer and the wafer holder are not shown in FIGS. 5-7. As shown in FIG. 5, two graphite plates 8 are used to heat the wafer from both sides instead of from only one side as in FIGS. 2-4. The distance between the two graphite plates 8 should be such that the wafer and the wafer holder may be smoothly transported to a location therebetween and smoothly withdrawn therefrom after heating.

Housing 25 completely encloses the two graphite plates except for an opening through which the wafer and wafer holder may be transported into and from the housing. A hole 27 is provided in the upper graphite plate and housing 25 to permit indirect sensing of the temperature of the wafer. Except for the opening for transporting the wafer and wafer holder and for hole 27, the two graphite plates and the wafer are all enclosed within a second housing 25 whose inside surfaces are coated by a dielectric film which reflects infrared radiation. Thus, radiation from the graphite plates 8 not directed towards the wafer are reflected by the inside surfaces of housing 25 back towards the graphite to increase the heating efficiency. Furthermore, housing 25 separates the protection gas inside housing 6 into two portions: a portion inside housing 25 and a portion outside housing 25. The portion inside housing 25 is also heated by the graphite plates and the radiation reflected by the inside surfaces of housing 25. Such portion of the gas performs the heat convection and conduction functions described above. With the structure of the system of FIGS. 5-7, the heat supplied by the graphite plates 8 are confined to a much smaller volume within housing 25 compared to the larger volume within housing 6 as in the embodiment of FIGS. 2-4. Since only a small portion of the gas in housing 6 (that is only the gas inside housing 25) now performs the heat convection and conduction functions, such functions are carried out much more efficiently. For these reasons the heating time required for heating a wafer from room temperature to about 1000 degrees centigrade is reduced from 3 seconds to under 2 seconds. During one test, with a six inch wafer, the power consumption of the apparatus of FIGS. 2-4 required for heating the wafer to 1000 degrees centigrade is about 22 kilowatts. With the apparatus of FIGS. 5-7, only about 6.6 kilowatts are required which amounts to a saving of 70%. The savings in power consumption is even more pronounced if the wafer is to be heated to above 1000 degrees. Housing 25 also prevents the cooler gas outside housing 25 from contacting the wafer; this prevents heat loss and temperature nonuniformity caused by such contact.

In one test, by using 2 graphite plates, the graphite plates need only be heated to about 1034 degrees centigrade for heating the wafer to 1000 degree centigrade; where only one graphite plate is used as in the embodiment of FIGS. 2-4, the single graphite plate must be heated to about 1138 degrees centigrade in order to heat the wafer to 1000 degrees centigrade.

The length and width of the graphite plate should each be greater than the diameter of the wafer plus the dimension of the small wafer which is also placed on top of the holder and near wafer. Thus, the wafer should be transported to a location between the graphite plates so that the wafer is away from hole 27; instead the small wafer is below hole 27 so that its temperature is sensed. The temperature of the wafer may then be determined by extrapolation from the temperature of the small wafer. By keeping the wafer away from hole 27 during the heating process, the adverse effects on the wafer exerted by the cooler gas from outside housing 25 which may escape to the chamber in housing 25 through hole 27 are minimized.

Housing 25 may be constructed from pure quartz plates to avoid metal ion contamination of the wafer. The dielectric film which reflects infrared radiation may be a silicon nitride layer coated by a conventional semiconductor method such as LPCVD or sputtering.

The above-described construction of apparatus and method for heat treatment of semiconductors is merely illustrative thereof and various changes in the detailed construction and method and different variations thereof may be within the scope of the appended claims.

We claim:

1. An apparatus for rapid heat treatment of semiconductor wafers in which ions have been implanted to anneal ion implantation damage and to activate ion-implanted dopants in the wafers, said apparatus comprising:

a housing;

means inside the housing holding a semiconductor wafer in which ions have been implanted;

a graphite heater in said housing spaced apart from the wafer for rapidly heating the wafer by radiation;

means inside the housing holding the heater;

a gas medium in the housing for accelerating absorption of heat originating from the graphite heater by the wafer during a time period when heat originating from the heater is absorbed by the wafer primarily through band-to-band electron transition, and for reducing the differences in temperature between different portions of the wafer when it is heated; and means for rapidly delivering the wafer holding means and the wafer to and withdrawing them from a location which is inside the housing and spaced apart from the heater so that the wafer is heated by heat from the heater and for rapidly withdrawing the wafer after heating, wherein said wafer holding means, heater holding means, said housing and the portion of the delivering and withdrawing means inside the housing during the heating process are made of quartz to reduce metal ion contamination.

2. The apparatus of claim 1, wherein the gas medium is substantially pure nitrogen, or a mixture of nitrogen and hydrogen.

3. The apparatus of claim 1, wherein the delivering and withdrawing means comprises:
- a quartz rod connected to the quartz wafer holder for transporting the holder and the wafer to and from the housing; and
- a quartz track supporting the wafer holder and on which the wafer holder is slidable smoothly by applying force to the rod.

4. The apparatus of claim 1, further comprising means for heating the graphite heater.

5. The apparatus of claim 4, wherein said graphite heater comprises a graphite plate and said heating means comprises a RF induction coil.

6. The apparatus of claim 5, wherein the graphite plate is elongated in shape for melting a narrow strip area of SOI (Polysilicon on Insulator) so that when it cools, recrystallization of SOI occurs, said apparatus being suitable for recrystallization of SOI.

7. The apparatus of claim 1, further comprising a pyrometer for directly measuring the temperature of the wafer without contacting the wafer.

8. An apparatus for rapid heat treatment of semiconductor wafers in which ions have been implanted to anneal ion implantation damage and to activate ion-implanted dopants in the wafers, said apparatus comprising:
- a first housing for holding a semiconductor wafer in which ions have been implanted;
- a graphite heater in said housing spaced apart from the wafer for rapidly heating the wafer by radiation;
- reflector means in the first housing for reflecting radiation from the graphite heater towards the graphite heater, said reflector means defining a second housing which encloses both the graphite heater and the wafer, said second housing defining an opening;
- means for rapidly delivering the wafer through the opening to a location inside the second housing and spaced apart from the heater so that the wafer is heated by heat from the heater and for rapidly withdrawing the wafer through the opening after heating; and
- a gas in the first and second housings for accelerating, by means of heat convection and heat conduction, absorption of heat originating from the graphite heater by the wafer during a time period when the wafer absorbs radiation from the heater incident thereon primarily through band-to-band electron transition, and for reducing the differences in temperature between different portions of the wafer when it is heated; so that the heat convection and conduction functions are performed substantially only by the portion of the gas inside the second housing, thereby increasing the efficiency of the gas in accelerating the absorption of heat by the wafer, wherein the second housing also substantially prevents the portion of the gas outside the second housing from contacting the wafer and heater, thereby reducing heat loss and temperature non-uniformity of the wafer caused by such contact.

9. The apparatus of claim 8, wherein said graphite heater comprises two graphite plates for heating both sides of the wafer through radiation incident on the wafer.

10. The apparatus of claim 9, wherein the top graphite plate defines a hole therein, said apparatus further comprising:
- a holder holding the wafer and a small wafer adjacent to the wafer, said two wafers being held by the holder between the two graphite plates so that the small wafer is adjacent to the hole and the wafer is spaced apart from the hole; and
- means for measuring the temperature of the small wafer through the hole for determining the temperature of the wafer.

11. A method for rapid serial heat treatment of individual semiconductor wafers made by ion implantation to anneal ion implantation damage and to activate ion-implanted dopants in the wafers, said method comprising:
- placing a semiconductor wafer in which ion have been implanted on a quartz wafer holder, said holder connected to a quartz rod;
- providing a gas in a quartz housing;
- rapidly delivering the wafer by means of the rod and holder from a location outside the housing to a location in the housing but spaced apart from a graphite element in the housing, said element being at a desired temperature, so that radiation from the element rapidly heats the wafer, and so that the gas between the heater and the wafer accelerates, by means of heat convection and heat conduction, the absorption of heat originating from the heater by the wafer when the wafer absorbs radiation incident thereon primarily through band-to-band electron transition, and reduces the differences in temperature between different portions of the wafer when it is heated; and
- rapidly withdrawing the wafer from the housing after a predetermined time period.

12. The method of claim 11, further comprising the step of directly measuring the temperature of a small wafer adjacent to the wafer without contacting the small wafer to determine the temperature of the wafer by extrapolation.

* * * * *

UNITED STATES PATENT AND TRADEMARK OFFICE
CERTIFICATE OF CORRECTION

PATENT NO. : 4,794,217
DATED : December 27, 1988
INVENTOR(S) : Quan, et al.

It is certified that error appears in the above-identified patent and that said Letters Patent is hereby corrected as shown below:

On the title page

Inventors: "Pei Xin Quan" should be --Pei Xin Qian--

Col. 7, line 30: "heating." should be --heating. The two graphite plates may also be coated with a silicon layer or a silicon carbide layer.--

Col. 8, line 30: "may be a silicon" should be --may be a structure of polysilicon layer - $SiO_2$ layer - polysilicon layer or a silicon--

Item (19) "Quan" should read -- Qian --.

Signed and Sealed this

Twenty-third Day of May, 1989

*Attest:*

DONALD J. QUIGG

*Attesting Officer*    *Commissioner of Patents and Trademarks*